(12) United States Patent
Fan

(10) Patent No.: US 11,177,460 B2
(45) Date of Patent: Nov. 16, 2021

(54) SUB-PIXEL STRUCTURE, PIXEL STRUCTURE, DISPLAY PANEL AND DISPLAY DEVICE

(71) Applicant: BOE TECHNOLOGY GROUP CO., LTD., Beijing (CN)

(72) Inventor: Xing Fan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 797 days.

(21) Appl. No.: 15/779,705

(22) PCT Filed: Dec. 4, 2017

(86) PCT No.: PCT/CN2017/114394
§ 371 (c)(1),
(2) Date: May 29, 2018

(87) PCT Pub. No.: WO2018/205573
PCT Pub. Date: Nov. 15, 2018

(65) Prior Publication Data
US 2021/0175473 A1    Jun. 10, 2021

(30) Foreign Application Priority Data
May 12, 2017 (CN) .......................... 201710336053.4

(51) Int. Cl.
*H01L 33/00* (2010.01)
*H01L 21/00* (2006.01)
(Continued)

(52) U.S. Cl.
CPC ...... *H01L 51/5265* (2013.01); *H01L 27/3211* (2013.01); *H01L 33/60* (2013.01); *H01L 51/5275* (2013.01)

(58) Field of Classification Search
CPC .. H01L 33/60; H01L 51/5275; H01L 51/5265
(Continued)

(56) References Cited

U.S. PATENT DOCUMENTS 6,686,676 B2 * 2/2004 McNulty ................ B82Y 20/00
313/112
8,115,219 B2 * 2/2012 Windisch ................ H01L 33/08
257/97
(Continued)

FOREIGN PATENT DOCUMENTS

CN    103490020 A    1/2014
CN    103682145 A    3/2014
(Continued)

OTHER PUBLICATIONS

First Office for Chinese Patent Application No. 201710336053.4 dated Jun. 5, 2018.
(Continued)

*Primary Examiner* — Calvin Lee
(74) *Attorney, Agent, or Firm* — Calfee, Halter & Griswold LLP

(57) ABSTRACT

A sub-pixel structure including: a light emitting device including a first electrode layer and a second electrode layer arranged opposite to each other, the first electrode layer and the second electrode layer together defining an optical microcavity. A first refractive layer is provided at a light exit surface of the light emitting device, the first refractive layer operable to reflect a portion of light emitted by the light emitting device back into the optical microcavity for interference. A second refractive layer is provided at a side of the first refractive layer facing away from the light exit surface, the second refractive layer operable to reflect a portion of the
(Continued)

light emitted by the light emitting device and transmitted through the first refractive layer back into the optical microcavity for interference.

18 Claims, 6 Drawing Sheets

(51) Int. Cl.
  *H01L 51/52* (2006.01)
  *H01L 27/32* (2006.01)
  *H01L 33/60* (2010.01)
(58) Field of Classification Search
  USPC .................................. 438/29–31, 69; 257/98
  See application file for complete search history.

(56) References Cited

U.S. PATENT DOCUMENTS

| | | | | |
|---|---|---|---|---|
| 8,860,051 | B2* | 10/2014 | Fellows | H01L 33/06 257/98 |
| 9,799,809 | B2* | 10/2017 | Yoo | H01L 33/502 |
| 10,734,551 | B2* | 8/2020 | Huang | H01L 33/382 |
| 2012/0039078 | A1* | 2/2012 | Masuda | G02F 1/133606 362/311.03 |
| 2014/0070187 | A1 | 3/2014 | Cho et al. | |
| 2016/0093828 | A1 | 3/2016 | Kim et al. | |
| 2017/0309861 | A1 | 10/2017 | Wang et al. | |

FOREIGN PATENT DOCUMENTS

| | | |
|---|---|---|
| CN | 103928489 A | 7/2014 |
| CN | 104091898 A | 10/2014 |
| CN | 105470405 A | 4/2016 |
| CN | 106601932 A | 4/2017 |
| CN | 107170901 A | 9/2017 |
| JP | 2016075736 A | 5/2016 |

OTHER PUBLICATIONS

Search Report and Written Opinion for International Application No. PCT/CN2017/114394 dated Mar. 5, 2018.
Tao, Haihua et al., "Microcavity Effects of Organc Electroluminescence", vol. 2, No. 2, pp. 61-64, Apr. 30, 2004, Publisher Optics & Opt Oelectronic Technology, Beijing China.

* cited by examiner

SUB-PIXEL STRUCTURE, PIXEL STRUCTURE, DISPLAY PANEL AND DISPLAY DEVICE

CROSS-REFERENCE TO RELATED APPLICATIONS

This application is the U.S. national phase entry of PCT/CN2017/114394, with an international filing date of Dec. 4, 2017, which claims the benefit of Chinese Patent Application No. 201710336053.4 filed on May 12, 2017, the entire disclosures of which are incorporated herein by reference.

TECHNICAL FIELD

The present disclosure relates to the field of self-luminous display technology, and in particular, to a sub-pixel structure, a pixel structure, a display panel, and a display device.

BACKGROUND

An organic light emitting diode (OLED) display device is a display device that displays based on the principle of self-luminescence of an organic electroluminescent material. It does not require a backlight and has the advantages of a high response speed and a good display effect. However, the image displayed by the OLED display panel may have a small brightness when viewed from a viewing angle of 0° (i.e., from the front of the display panel) or may have a relatively large color coordinate shift when viewed from different viewing angles. This may affect the display effect of the display panel.

SUMMARY

It would be advantageous to provide a mechanism that can alleviate, mitigate or eliminate one or more of the above problems.

According to an aspect of the present disclosure, a sub-pixel structure is provided, comprising: a light emitting device comprising a first electrode layer and a second electrode layer arranged opposite to each other, the first electrode layer and the second electrode layer together defining an optical microcavity; a first refractive layer provided at a light exit surface of the light emitting device, the first refractive layer operable to reflect a portion of light emitted by the light emitting device back into the optical microcavity for interference; and a second refractive layer provided at a side of the first refractive layer facing away from the light exit surface, the second refractive layer operable to reflect a portion of the light, emitted by the light emitting device and transmitting through the first refractive layer, back into the optical microcavity for interference.

In certain exemplary embodiments, the first refractive layer has a different refractive index from a refractive index of the second refractive layer. In certain exemplary embodiments, the refractive index of the first refractive layer and the refractive index of the second refractive layer differ by at least 0.3.

In certain exemplary embodiments, the second refractive layer is sized such that an orthogonal projection of the second refractive layer on the first refractive layer completely covers the first refractive layer.

In certain exemplary embodiments, the second refractive layer comprises a plurality of sections having different thicknesses, and the plurality of sections is arranged in a plane parallel to the light exit surface. In certain exemplary embodiments, the plurality of sections is separately arranged such that there is a gap between every two immediately adjacent ones of the sections. In certain exemplary embodiments, each of the plurality of sections is shaped such that an orthographic projection of the section on the first refractive layer has a shape selected from the group consisting of a square and a ring.

In certain exemplary embodiments, the second refractive layer is sized such that an orthogonal projection of the second refractive layer on the first refractive layer covers only part of the first refractive layer. In certain exemplary embodiments, the second refractive layer is shaped such that the orthogonal projection of the second refractive layer on the first refractive layer has a shape selected from the group consisting of a square and a ring.

According to another aspect of the present disclosure, a pixel structure is provided comprising a plurality of sub-pixel structures arranged side by side. At least one of the sub-pixel structures is the sub-pixel structure described above.

In certain exemplary embodiments, each of the plurality of sub-pixel structures is the sub-pixel structure described above, the second refractive layer of each of the sub-pixel structures comprises a plurality of sections having different thicknesses, and the plurality of sections is arranged in a plane parallel to the light exit surface. In certain exemplary embodiments, the second refractive layers of the plurality of sub-pixel structures are arranged such that portions of the second refractive layers alongside a boundary between every two immediately adjacent ones of the sub-pixel structures are combined and share a same thickness.

In certain exemplary embodiments, each of the plurality of sub-pixel structures is the sub-pixel structure described above, and the second refractive layer of each of the sub-pixel structures is sized such that an orthogonal projection of the second refractive layer on the first refractive layer covers only part of the first refractive layer. In certain exemplary embodiments, the second refractive layers of the plurality of sub-pixel structures share a same thickness and are arranged such that the second refractive layer of one of the sub-pixel structures is combined with the second refractive layer of an immediately adjacent one of the sub-pixel structures.

In certain exemplary embodiments, each of the plurality of sub-pixel structures is the sub-pixel structure described above, and the second refractive layer of at least one of the sub-pixel structures is sized such that an orthographic projection of the second refractive layer on the first refractive layer completely covers the first refractive layer.

According to yet another embodiment of the present disclosure, a display panel is provided comprising a plurality of the pixel structures described above. The pixel structures being arranged in an array.

In certain exemplary embodiments, only a specific one of the plurality of sub-pixel structures of each of the plurality of pixel structures has a second refractive layer, the second refractive layer either comprises a plurality of sections having different thicknesses and arranged in a plane parallel to the light exit surface, is sized such that its orthographic projection on the first refractive layer covers only part of the first refractive layer, or both.

In certain exemplary embodiments, the specific sub-pixel structures are operable to emit light of a same color. In certain exemplary embodiments, the light of the same color is blue light.

According to still yet another embodiment of the present disclosure, a display device is provided comprising the display panel described above.

These and other embodiments of the present disclosure will be apparent from and elucidated with reference to the embodiment(s) described hereinafter.

BRIEF DESCRIPTION OF THE DRAWINGS

The drawings are provided for a further understanding of the present disclosure, which form a part of the present disclosure and are not intended to be construed as limiting the present disclosure. In the drawing.

DETAILED DESCRIPTION

Figure 1:
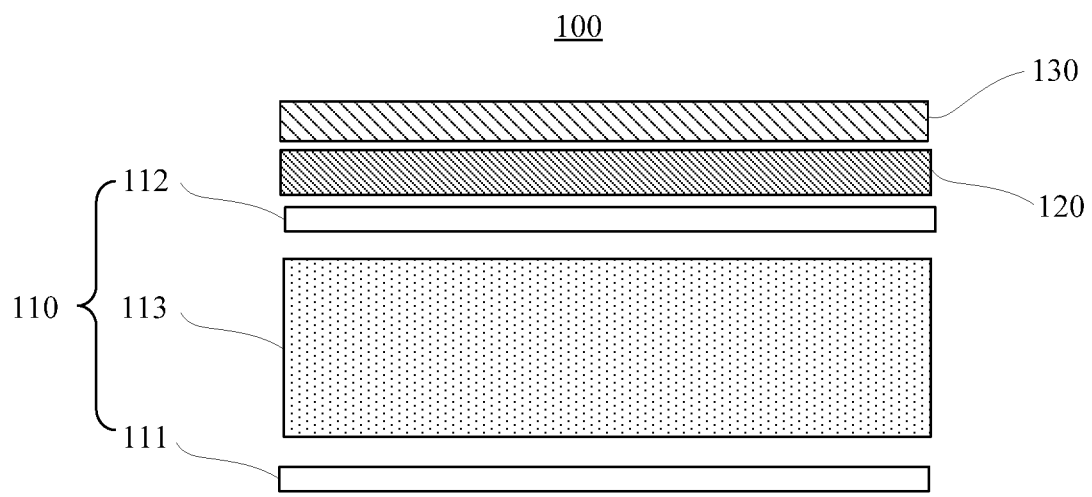
FIG. 1 is a schematic cross-sectional view of a sub-pixel structure according to an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1 is a schematic cross-sectional view of a sub-pixel structure 100 according to an embodiment of the present disclosure. As shown in FIG. 1, the sub-pixel structure 100 includes a light emitting device 110, a first refractive layer 120, and a second refractive layer 130.

The light emitting device 110 includes a first electrode layer 111, a second electrode layer 112 disposed opposite to the first electrode layer 111, and a light emitting layer 113 sandwiched between the first electrode layer 111 and the second electrode layer 112. The first electrode layer 111 and the second electrode layer 112 together define an optical microcavity. As is known, the optical microcavity is an optical resonant cavity that typically has a dimension on the order of microns or sub-microns. It utilizes the effects of reflection, total reflection, scattering, diffraction, or the like at an interface with discontinuous refractive indices to confine the light to a small area for resonance or interference. (See "Organic Electroluminescent Optical Microcavity Effect", Haihua Tao et al., Optics and Optoelectronic Technology, Vol. 2, No. 2, 2004, pp. 61-63.) For this purpose, the first electrode layer 111 may be provided with a reflective layer (not shown), and the second electrode layer 112 may be provided with a semi-transmissive layer (not shown). The reflective layer may be made of a reflective, opaque metal material such as silver, iron, or other opaque material. In the case of the silver, the reflective layer typically has a thickness of 100 nm. The semi-transmissive layer may be made of a semi-transmissive silver alloy or other semi-transmissive material. In the case of the silver alloy, the semi-transmissive layer typically has a thickness of 14 nm.

The light emitting device 110 may be an organic light emitting diode, or it may be other self-luminous devices. In the case of the organic light emitting diode, the first electrode layer 111 may be an anode layer and the second electrode layer 112 may be a cathode layer (e.g., for a top emission type device). Alternatively, the first electrode layer 111 may be a cathode layer and the second electrode layer 112 may be an anode layer (e.g., for a bottom emission type device).

The first refractive layer 120 is provided at a light exit surface (an upper surface of the second electrode layer 112 in the figure) of the light emitting device 110. The first refractive layer 120 is operable to reflect a portion of light emitted by the light emitting device 110 back into the optical microcavity defined by the first electrode layer 111 and the second electrode layer 112.

The second refractive layer 130 is provided at a side of the first refractive layer 120 facing away from the light exit surface. The second refractive layer 130 is operable to reflect a portion of the light, emitted by the light emitting device 110 and transmitted through the first refractive layer 120, back into the optical microcavity.

By virtue of the microcavity effect of the optical microcavity, the light reflected by the second refractive layer 130 can interfere with the light reflected by the first refractive layer 120 (and potentially the primary light emitted by the light emitting device 110) in the optical microcavity, providing an improved visual effect for the sub-pixel structure. In order to provide the desired reflection by the first and second refractive layers 120 and 130, the refractive index of the first refractive layer 120 is different from the refractive index of the second refractive layer 130. According to experience, a difference of greater than 0.3 between the refractive index of the first refractive layer 120 and the refractive index of the second refractive layer 130 may be appropriate. For example, the first refractive layer 120 has a refractive index of 1.8, and the second refractive layer 130 has a refractive index of 1.4. In an exemplary embodiment, the first refractive layer 120 may be made of Alq3 or NPB, and the second refractive layer 130 may be made of LiF or $MgF_2$. However, other embodiments are possible. For example, the first refractive layer 120 may have a smaller refractive index than the second refractive layer 130. For another example, the first and second refractive layers 120 and 130 may be made of the same material.

In the sub-pixel structure 100 of FIG. 1, the second refractive layer 130 is sized such that its orthographic projection on the first refractive layer 120 completely covers the first refractive layer 120. By doing so, a larger amount of light interferes in the optical microcavity such that light exiting the sub-pixel structure 100 has increased emission intensity at the emission peak. This allows for enhanced light emission (i.e., enhanced luminance) at the front of the sub-pixel structure 100 where the viewing angle is 0°.

Figure 2:
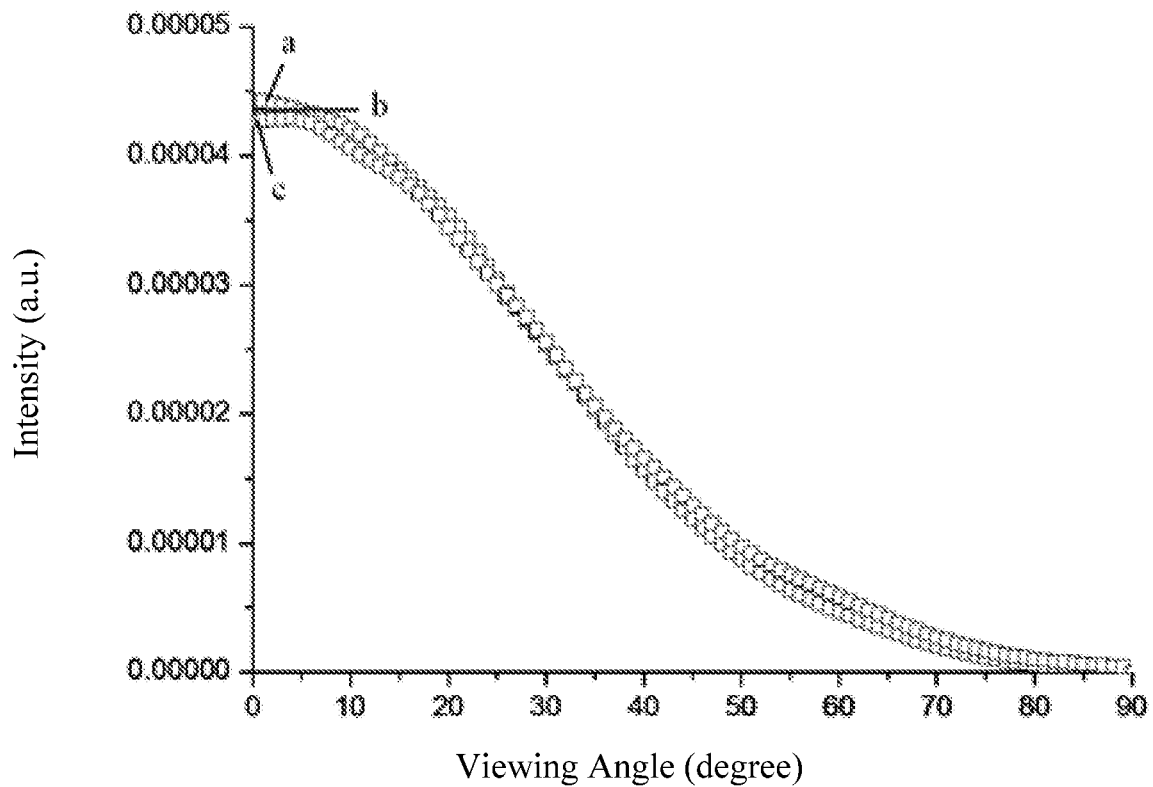
FIG. 2 is a graph of light intensity versus viewing angle for the sub-pixel structure of FIG. 1 with the second refractive layer having different thicknesses.

FIG. 2 is a graph of light intensity vs. viewing angle for the sub-pixel structure 100 of FIG. 1 with the second refractive layer 130 having different thicknesses. In this figure, curve a is an intensity graph of the sub-pixel structure 100 with the second refractive layer 130 having a thickness of 20 nm, curve b is an intensity graph of the sub-pixel structure 100 with the second refractive layer 130 having a thickness of 10 nm, and the curve c is an intensity curve of the sub-pixel structure 100 with the second refractive layer 130 having a thickness of 0 nm (i.e., without the second refractive layer 130).

As can be seen from the curves a, b, and c, the luminance at the front of the sub-pixel structure 100 (where the viewing angle is 0°) can be effectively improved by providing the second refractive layer 130 at the side of the first refractive layer 120 facing away from the light exit surface of the light emitting device 110. Moreover, the sub-pixel structure 100 having the thicker second refractive layer 130 provides higher front luminance.

Figure 3:
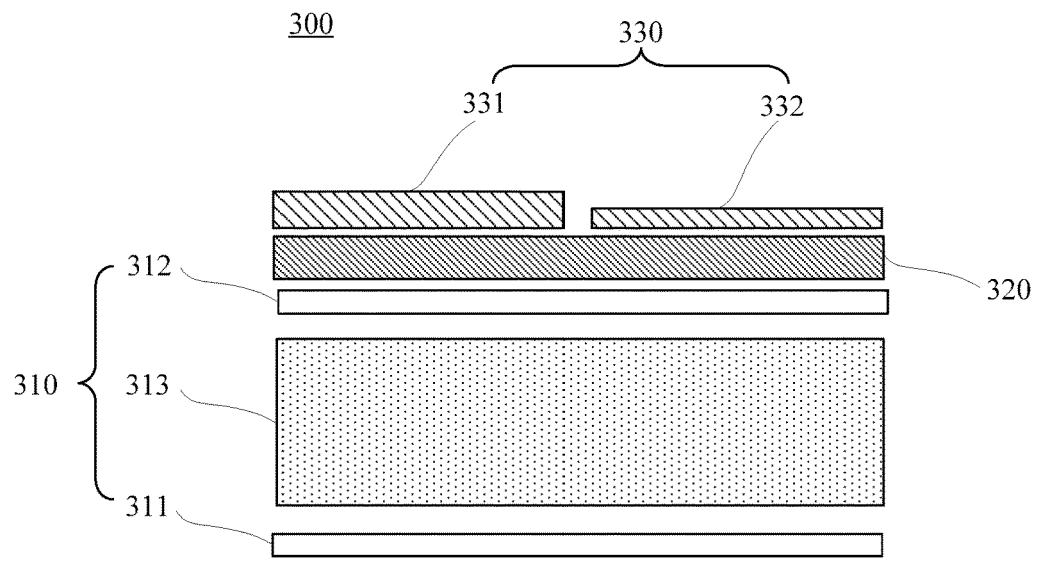
FIG. 3 is a schematic cross-sectional view of a sub-pixel structure according to an embodiment of the present disclosure.

FIG. 3 is a schematic cross-sectional view of a sub-pixel structure 300 according to an embodiment of the present disclosure. As shown in FIG. 3, the sub-pixel structure 300 includes a light emitting device 310, a first refractive layer 320, and a second refractive layer 330.

The light emitting device 310 includes a first electrode layer 311, a second electrode layer 312 disposed opposite to the first electrode layer 311, and a light emitting layer 313 sandwiched between the first electrode layer 311 and the second electrode layer 312. The configuration of the light emitting device 310 and the first refractive layer 320 may be the same as that of the light emitting device 110 and the first refractive layer 120 described above, and thus detailed description thereof is omitted here.

The sub-pixel structure 300 is different from the sub-pixel structure 100 in that the second refractive layer 330 includes a plurality of sections having different thicknesses. In the example of FIG. 3, the second refractive layer 330 includes a first section 331 having a relatively large thickness and a second section 332 having a relatively small thickness, which are disposed in a plane parallel to a light exit surface of the light emitting device 310 (the upper surface of the second electrode layer 312 in this figure).

After the light emitted from the light emitting device 310 transmits through the first refractive layer 320, a portion thereof is reflected back into the light emitting device 310 by the first and second portions 331, 332, and another portion thereof is transmits out of the pixel structure 300 from the two portions 331 and 332. Due to the different thicknesses of the first and second portions 331, 332, the light reflected by these two portions back into the light emitting device 310 has different characteristics, resulting in respective different color shifts and spectra of the light emitted by the sub-pixel structure 300 from the two portions 331 and 332. In this regard, the portion of the sub-pixel structure 300 corresponding to the first section 331 serves as one light source, and the portion of the sub-pixel structure 300 corresponding to the second section 332 serves as another light source. Since the sub-pixel structure is typically of such a small size that it cannot be discerned by the human eyes, the sub-pixel structure 300 as a whole can be regarded as a combined light source that is a combination of these two light sources. The spectrum of the light emitted by this combined light source is the average of the spectra of the two light sources. The sub-pixel structure 300 can also be viewed as a combination of two sub-pixel structures 100 (which have second refractive layers of different thicknesses). As described above, since the sub-pixel structure 100 provides increased luminance at a viewing angle of 0°, the sub-pixel structure 300 typically also provides increased luminance at the viewing angle of 0°.

The plurality of sections included in the second refractive layer 330 may be separately formed on the first refractive layer 320 such that there may be a gap between each two immediately adjacent sections (e.g., 331 and 332), as shown in FIG. 3. Alternatively, the plurality of sections included in the second refractive layer 330 may be formed integrally. In the former case, the second refractive layer 330 can be easily fabricated using a Fine Metal Mask (FMM) process. In addition, the sections 331 and 332 may be shaped such that the shape of their orthographic projection on the first refracting layer 320 may be a square shape or a ring shape. Of course other shapes are also possible.

Figure 4:
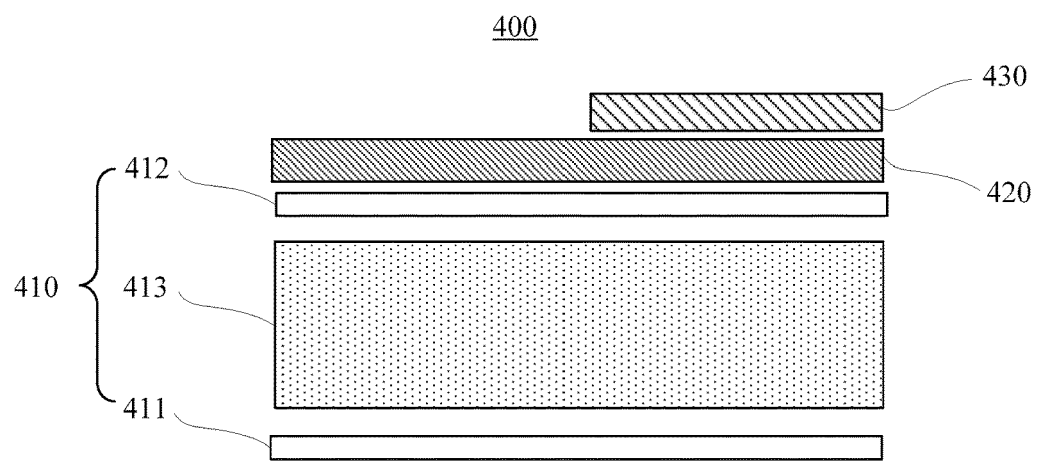
FIG. 4 is a schematic cross-sectional view of a sub-pixel structure according to an embodiment of the present disclosure.

FIG. 4 is a schematic cross-sectional view of a sub-pixel structure 400 according to an embodiment of the present disclosure. As shown in FIG. 4, the sub-pixel structure 400 includes a light emitting device 410, a first refractive layer 420, and a second refractive layer 430.

The light emitting device 410 includes a first electrode layer 411, a second electrode layer 412 disposed opposite to the first electrode layer 411, and a light emitting layer 413 sandwiched between the first electrode layer 411 and the second electrode layer 412. The configuration of the light emitting device 410 and the first refractive layer 420 may be the same as that of the light emitting device 110 and the first refractive layer 120 described above, and thus detailed description thereof is omitted herein.

The sub-pixel structure 400 is different from the sub-pixel structure 100 in that the second refractive layer 430 is sized such that its orthographic projection on the first refractive layer 420 covers only part of the first refractive layer 420. In the example of FIG. 4, the orthogonal projection of the second refractive layer 430 on the first refractive layer 420 covers only the right half of the first refractive layer 420.

Similar to the sub-pixel structure 300, the sub-pixel structure 400 can also be viewed as a combination of two sub-pixel structures 100, except that one of the two sub-pixel structures 100 has a second refractive layer 130 with a thickness of zero. The spectrum of the light emitted by the sub-pixel structure 400 is therefore the average of the spectra of the light emitted by the two sub-pixel structures 100. It can be deduced from curve a and curve c shown in FIG. 2 that the sub-pixel structure 400 still provides increased luminance at the viewing angle of 0° compared to the case where the second refractive layer 430 is otherwise not provided.

In the sub-pixel structure 400, the second refractive layer 430 may be shaped such that its orthographic projection on the first refractive layer 420 is a square or a ring. Of course other shapes are also possible.

In addition to the luminance aspect, the sub-pixel structures 300 and 400 proposed herein may also provide improved color coordinate shifts at large viewing angles (e.g., 60°). Table 1 below shows simulation results of the color coordinate shift for the sub-pixel structures 100, 300, and 400.

TABLE 1

| Type of sub-pixel | Thickness of second refractive layer (nm) | Viewing angle (°) | CIEx | CIEy | Δu'Δv' (color shift) |
|---|---|---|---|---|---|
| Sub-pixel structure 300 | 20 (first section) + 10 (second section) | 0 | 0.1499 | 0.0306 | 0 |
| | | 60 | 0.15 | 0.0352 | 0.012139 |
| Sub-pixel structure 400 | 20 (first section) + 0 (second section) | 0 | 0.1499 | 0.031 | 0 |
| | | 60 | 0.1497 | 0.0351 | 0.010907 |
| Sub-pixel structure 100 | 20 | 0 | 0.143589 | 0.045576 | 0 |
| | | 60 | 0.140954 | 0.059818 | 0.033142 |
| | 10 | 0 | 0.143346 | 0.047196 | 0 |
| | | 60 | 0.140253 | 0.061979 | 0.034065 |
| | 0 | 0 | 0.142747 | 0.04943 | 0 |
| | | 60 | 0.139984 | 0.062868 | 0.030583 |

In Table 1, CIEx represents the x value of the color coordinate, and CIEy represents the y value of the color coordinate. As can be seen from Table 1, the color shifts of the sub-pixel structures 300 and 400 at the viewing angle of 60° are smaller than the color shift of the sub-pixel structure 100 at the viewing angle of 60°. Also, it can be deduced from the simulation results of the sub-pixel structures 300 and 400 that the larger the difference in thickness between the two sections 331 and 332 included in the second refractive layer 330, the smaller the color shift obtained at the viewing angle of 60°. In addition, as can also be seen from Table 1, whether it is at the viewing angle of 0° or the viewing angle of 60°, the sub-pixel structures 100, 300 and 400 all provide a reduced y value of the color coordinate as compared to a sub-pixel structure in which the second refractive layer has a thickness of 0 (i.e., without the second refractive layer). It is known that in the case of a decrease in the y value of the color coordinate, the color of the light generally subjects to a blue shift. Therefore, if the light emitting layers 113, 313, and 413 of the light emitting devices 110, 310, and 410 employ a blue light material, the sub-pixel structures 100 (the thickness of the second refractive layer greater than 0), 300, and 400 proposed herein can produce light of a deeper blue color. This allows blue sub-pixels to be made using less-good blue light materials, thereby providing a high quality blue light source in a cost-effective manner. Compared with the prior art in which deepened blue light is provided by increasing the operating voltage applied to the light emitting layer, this can also avoid a reduced lifetime of the blue sub-pixel and thus a reduced lifetime of the entire display panel resulting from the increased operating voltage.

In various embodiments, the FMM process may be used to form the desired second refractive layer on the first refractive layer. Accounting for the inherent edge effect of the FMM (which typically results in an overlap between sections that should have been separated), the sub-pixel structure 400 may be advantageous in that it provides a greater pitch between the second refractive layers 430 of the sub-pixels and therefore does not require an FMM with a high precision. In contrast, the sub-pixel structure 300 may require a high-precision FMM due to a small gap between the sections of the second refractive layer 330.

Figure 5:
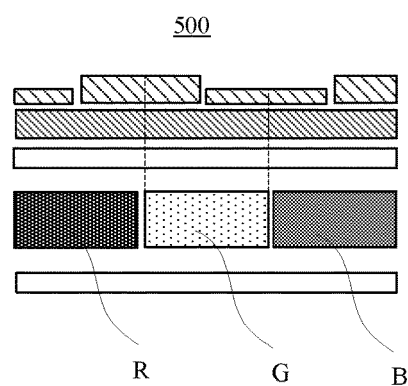
FIG. 5 is a schematic cross-sectional view of a pixel structure according to an embodiment of the present disclosure.

FIG. 5 is a schematic cross-sectional view of a pixel structure 500 according to an embodiment of the present disclosure. As shown in FIG. 5, the pixel structure 500 includes a red sub-pixel R, a green sub-pixel and a blue sub-pixel B arranged side by side. The term "arranged side-by-side" as used herein is not intended to mean that the sub-pixels are necessarily arranged on a straight line when viewed from above. Instead, the sub-pixels may be arranged in other patterns. For example, the sub-pixels may be arranged in an RGB arrangement or a pentile arrangement. Other patterns of course are also possible.

The pixel structure 500 can be seen as a combination of three sub-pixel structures 300 each having a second refractive layer including a plurality of sections having different thicknesses. In the example of FIG. 5, the second refractive layers of the three sub-pixel structures 300 are arranged such that portions of the second refractive layers alongside a boundary between each two immediately adjacent sub-pixel structures are combined and share the same thickness. Specifically, as shown in FIG. 5, the sub-pixels R and G share one second refractive layer portion at the boundary therebetween (indicated by the dashed line to the left), and the sub-pixels G and B share a second refractive layer portion at the boundary therebetween (indicated by the dashed line to the right). This can reduce the requirement for the precision of the FMM process.

The pixel structure 500 shown in FIG. 5 is exemplary. In other embodiments, the pixel structure 500 may be a simple repetitive arrangement of the sub-pixel structure 300 shown in FIG. 3, meaning that the second refractive layer portions at the boundary between each two immediately adjacent sub-pixel structures 300 do not share the same thickness. In either case, there may or may not be a gap between the sections of the second refractive layer of the same sub-pixel structure and between immediately adjacent second refractive layer portions of each two immediately adjacent sub-pixel structures.

Figure 6:
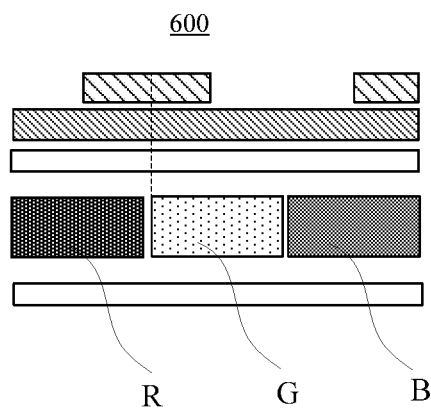
FIG. 6 is a schematic cross-sectional view of a pixel structure according to an embodiment of the present disclosure.

FIG. 6 is a schematic cross-sectional view of a pixel structure 600 according to an embodiment of the present disclosure. As shown in FIG. 6, the pixel structure 600 includes a red sub-pixel R, a green sub-pixel and a blue sub-pixel B arranged side by side.

The pixel structure 600 is different from the pixel structure 500 in that it can be seen as a combination of three sub-pixel structures 400 each having a second refractive layer, the second refractive layer being sized such that the orthographic projection of the second refractive layer on the first refractive layer covers only part of the first refractive layer. In the example of FIG. 6, the second refractive layers of the three sub-pixel structures 400 share the same thickness and are arranged such that the second refractive layer of one of the sub-pixel structures is combined with the second refractive layer of a directly adjacent one of the sub-pixel structures. Specifically, as shown in FIG. 6, the second refractive layer of the sub-pixel R is combined with the second refractive layer of the sub-pixel G This can reduce the requirement for the precision of the FMM process.

The pixel structure 600 shown in FIG. 6 is exemplary. In other embodiments, the pixel structure 600 may be a simple repetitive arrangement of the sub-pixel structures 400 shown in FIG. 4, i.e., no sub-pixel structures share the second refractive layer.

In the above embodiments, the pixel structures 500 and 600 can be used for the purpose of adjusting the color shift of all three colors R, and B because all their sub-pixel structures are sub-pixel structures 300 or 400, which has good color shift adjustment ability as described above.

Figure 7:
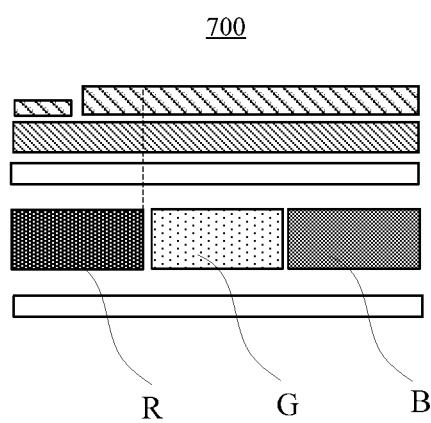
FIG. 7 is a schematic cross-sectional view of a pixel structure according to an embodiment of the present disclosure.
Figure 8:
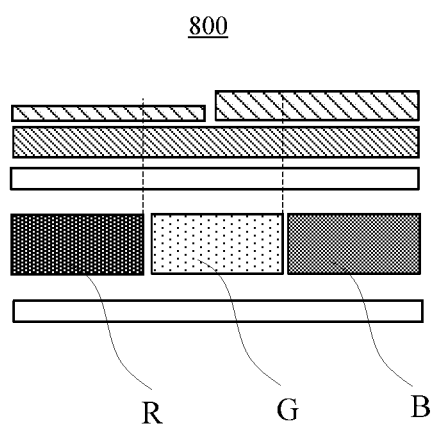
FIG. 8 is a schematic cross-sectional view of a pixel structure according to an embodiment of the present disclosure.
Figure 9:
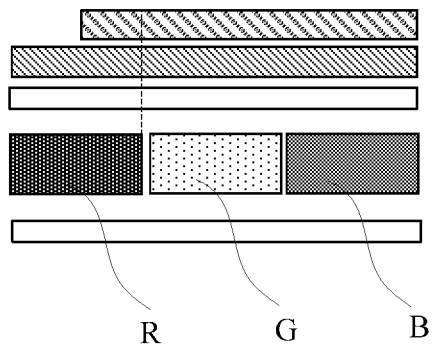
FIG. 9 is a schematic cross-sectional view of a pixel structure according to an embodiment of the present disclosure.

FIGS. 7-9 are schematic cross-sectional views of pixel structures 700, 800, and 900, respectively, according to embodiments of the disclosure. As shown in FIGS. 7-9, each of the pixel structures 700, 800, and 900 includes a red sub-pixel R, a green sub-pixel and a blue sub-pixel B arranged side by side.

The pixel structure 700 can be viewed as a combination of one sub-pixel structure 300 and two sub-pixel structures 100. In the example of FIG. 7, the sub-pixel R is configured as the sub-pixel structure 300, and the sub-pixels G and B are each configured as the sub-pixel structure 100. A portion of the second refractive layer of the sub-pixel R is combined with the second refractive layers of the sub-pixels G and B. This can reduce the requirement for the precision of the FMM process.

The pixel structure 800 can be considered as another combination of one sub-pixel structure 300 and two sub-pixel structures 100. In the example of FIG. 8, the sub-pixel G is configured as the sub-pixel structure 300, and the sub-pixels R and B are each configured as the sub-pixel structure 100. A portion of the second refractive layer of the sub-pixel G is combined with the second refractive layer of the sub-pixel R, and another portion of the second refractive layer of the sub-pixel G is combined with the second refractive layer of the sub-pixel B. This can reduce the requirement for the precision of the FMM process.

The pixel structure 900 can be viewed as a combination of one sub-pixel structure 400 and two sub-pixel structures 100. In the example of FIG. 9, the sub-pixel R is configured as the sub-pixel structure 400, and the sub-pixels G and B are each configured as the sub-pixel structure 100. The second refractive layer of the sub-pixel R is combined with the second refractive layers of the sub-pixels G and B. This can reduce the requirement for the precision of the FMM process.

The pixel structures 700, 800, and 900 described above may be used for color shift adjustment of a portion of the sub-pixels because each of them includes two sub-pixel structures 100, which do not have a good ability of color shift adjustment as the sub-pixel structures 300 and 400. It will be understood that the pixel structures 700, 800, and 900 shown in FIGS. 7-9 are exemplary, and that other combinations of the sub-pixel structures 100, 300, and 400 are possible in other embodiments.

In addition, although the pixel structures 500-900 are described and illustrated as including three sub-pixel structures 100, 300, or 400 in the above embodiments, this is not necessary. In other embodiments, one pixel structure may include, for example, four sub-pixel structures (RGBW). Alternatively or in addition, it may be possible that only a portion of the sub-pixel structures in the pixel structure has the structure proposed herein.

Figure 10:
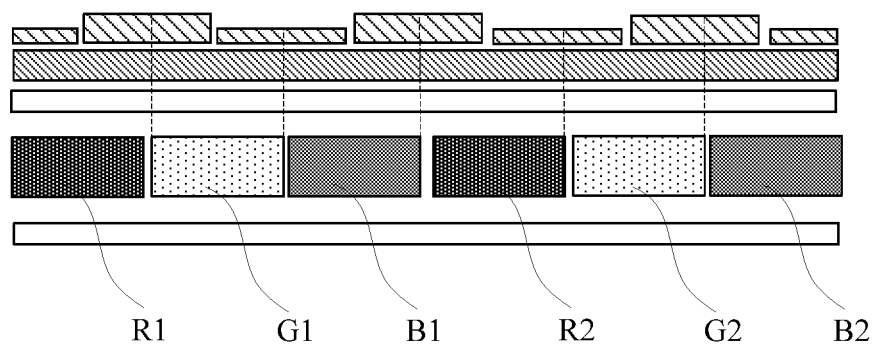
FIG. 10 is a schematic cross-sectional view of a display panel according to an embodiment of the present disclosure.

FIG. 10 is a schematic cross-sectional view of a display panel 1000 according to an embodiment of the present disclosure. As shown in FIG. 10, the display panel 1000 includes a plurality of pixel structures, only two of which are shown. The shown pixel structures include a first pixel structure including sub-pixels R1, G1, and B1 and a second pixel structure including sub-pixels R2, G2, and B2.

The display panel 1000 can be seen as a combination of the pixel structures 500. In the example of FIG. 10, the portions of the second refracting layers alongside the boundary between immediately adjacent pixel structures are combined. Specifically, a portion of the second refractive layer of the sub-pixel B1 and a portion of the second refractive layer of the sub-pixel R2 share the same thickness and are combined together. This can reduce the requirement for the precision of the FMM process.

It will be understood that the display panel 1000 shown in FIG. 10 is exemplary and that other embodiments are possible. For example, the display panel 1000 may be a simple repetitive arrangement of the pixel structure 500 shown in FIG. 5. For another example, there may or may not be a gap between the second refractive layer portions. It will also be understood that the display panel 1000 further includes electronic elements and associated wires for controlling the pixel structures that are not shown in order not to obscure the subject matter of the present disclosure.

Figure 11:
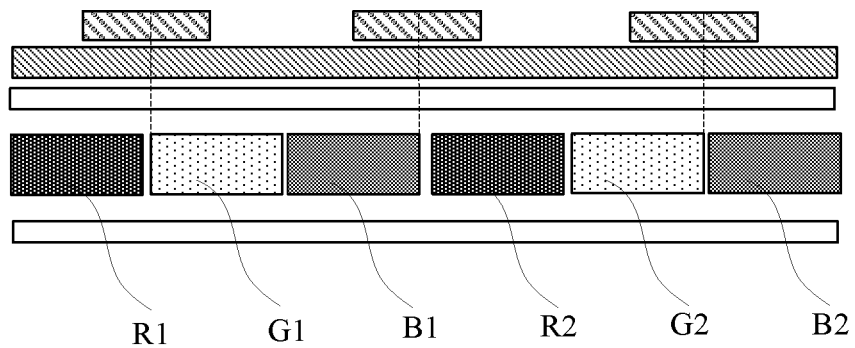
FIG. 11 is a schematic cross-sectional view of a display panel according to an embodiment of the present disclosure.
Figure 12:
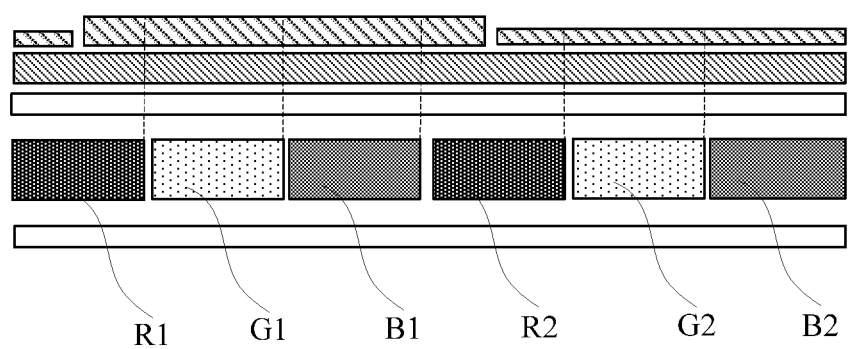
FIG. 12 is a schematic cross-sectional view of a display panel according to an embodiment of the present disclosure.
Figure 13:
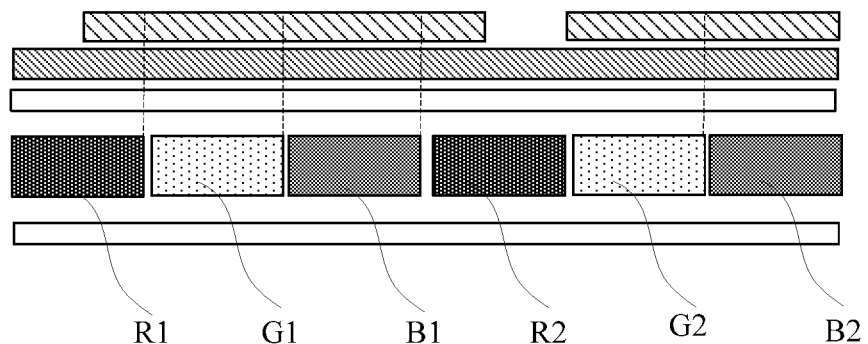
FIG. 13 is a schematic cross-sectional view of a display panel according to an embodiment of the present disclosure.

FIGS. 11-13 are schematic cross-sectional views of display panels 1100, 1200, and 1300, respectively, according to embodiments of the present disclosure. As shown in FIGS. 11-13, each of the display panels 1100, 1200, and 1300 includes a plurality of pixel structures, only two of which are shown, one including sub-pixels R1, G1, and B1, and the other including sub-pixel R2, G2 and B2.

The display panel 1100 can be viewed as a combination of the pixel structures 600. In the example of FIG. 11, the second refracting layers alongside the boundary between two directly adjacent pixel structures are combined. Specifically, the second refractive layer of the sub-pixel B1 and the second refractive layer of the sub-pixel R2 are combined. This can reduce the requirement for the precision of the FMM process. Advantageously, the second refractive layers of the individual pixel structures have the same thickness, allowing them to be formed using a one-time patterning process.

It will be understood that the display panel 1100 shown in FIG. 11 is exemplary, and that the display panel 1100 may be other combinations of the pixel structures 600 in other embodiments. For example, the display panel 1100 may be a simple repetitive arrangement of the pixel structure 600 shown in FIG. 6.

The display panel 1200 can be viewed as a combination of the pixel structures 700. In the example of FIG. 12, the second refracting layers alongside the boundary between two immediately adjacent pixel structures are combined. Specifically, the second refractive layer of the sub-pixel B1 and a portion of the second refractive layer of the sub-pixel R2 are combined. This can reduce the requirement for the precision of the FMM process. Advantageously, the second refractive layers that are combined have the same thickness, allowing them to be formed using a one-time patterning process.

It will be understood that the display panel 1200 shown in FIG. 12 is exemplary, and that the display panel 1200 may be other combinations of the pixel structures 700 or 800 in other embodiments. For example, the display panel 1200 may be a simple repetitive arrangement of the pixel structure 700 shown in FIG. 7.

The display panel 1300 can be viewed as a combination of the pixel structures 900. In the example of FIG. 13, the second refractive layers in immediately adjacent two pixel structures alongside the boundary therebetween are combined. Specifically, the second refractive layer of the sub-pixel B1 and a portion of the second refractive layer of the sub-pixel R2 are combined. This can reduce the requirement for the precision of the FMM process. Advantageously, the second refractive layers of the individual pixel structures have the same thickness, allowing them to be formed using a one-time patterning process.

It will be understood that the display panel 1300 shown in FIG. 13 is exemplary, and that the display panel 1300 may be other combinations of the pixel structures 900 in other embodiments. For example, the display panel 1300 may be a simple repetitive arrangement of the pixel structure 900 shown in FIG. 9.

The display panels 1200 and 1300 described above may be used for the purpose of color shift adjustment of the sub-pixels of a single color because their pixel structures each include only one sub-pixel structure 300 or 400, which has a good color shift adjustment ability as previously described. This may be particularly advantageous for adjusting the color shift of the blue sub-pixels because the blue light emitted by the luminescent materials now available is typically undesirable. It will be understood that the display panels 1000, 1100, 1200, and 1300 shown in FIGS. 10-13 are exemplary and that other embodiments are possible.

Figure 14:
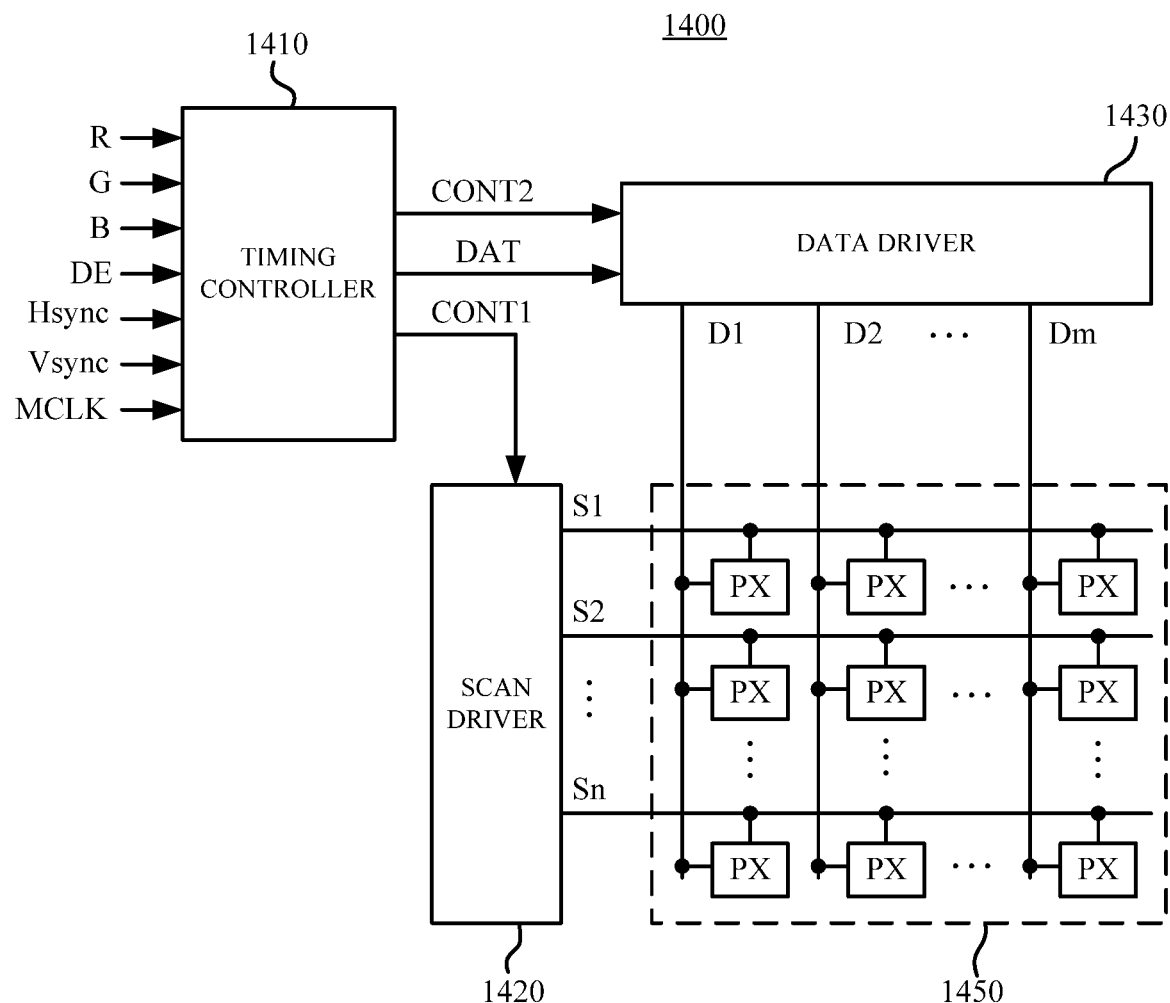
FIG. 14 is a schematic block diagram of a display device according to an embodiment of the present disclosure.

FIG. 14 is a schematic block diagram of a display apparatus 1400 according to an embodiment of the present disclosure. Referring to FIG. 14, the display device 1400 includes a timing controller 1410, a scan driver 1420, a data driver 1430, and a display panel 1450.

The display panel 1450 includes pixels PX arranged in an array. In the display panel 1450, a plurality of substantially parallel scan lines S1 to Sn extend in a row direction, and a plurality of substantially parallel data lines D1 to Dm extend in a column direction. The scan lines S1 to Sn and the data lines D1 to Dm are coupled to the pixels PX. The display panel 1450 may be any one of the display panels 1000, 1100, 1200, or 1300 described above with respect to FIGS. 10 to 13, and thus detailed description thereof is omitted here.

The timing controller 1410 receives synchronization signals and video signals R, and B from a system interface. The synchronization signals include a horizontal synchronization signal Hsync, a vertical synchronization signal Vsync, a master clock signal MCLK, and a data enable signal DE. The video signals R, G, and B contain luminance information for each of the plurality of pixels PX. The timing controller 1410 generates a first driving control signal CONT1, a second driving control signal CONT2, and image data based on the video signals R, and B, the horizontal synchronization signal Hsync, the vertical synchronization signal Vsync, the data enable signal DE, and the master clock signal MCLK Signal DAT. The first driving control signal CONT1 includes a frame start signal FLM, a first clock signal SCLK1, and a second clock signal SCLK2. The frame start signal FLM may be a signal that generates a first scan signal S[1] for displaying a single frame image. The first clock signal SCLK1 and the second clock signal SCLK2 are synchronization signals for sequentially generating the scan signals S[1]-S[n] applied to the corresponding scan lines S1-Sn. The timing controller 1410 divides the video signals R, and B into units of frames according to the vertical synchronization signal Vsync, and divides the video signals R, and B into units of data lines according to the horizontal synchronization signal Hsync to generate an image data signal DAT. The timing controller 1410 transmits the image data signal DAT and the second driving control signal CONT2 to the data driver 1430.

The scan driver 1420 is coupled to the scan lines S1-Sn, and generates corresponding plural of scan signals S[1] to S[n] according to the first driving control signal CONT1. The scan driver 1420 may sequentially apply the scan signals S[1]-S[n] to the scan lines S1-Sn.

The data driver 1430 is coupled to the data lines D1-Dm, samples and holds the image data signal DAT according to the second driving control signal CONT2, and applies a plurality of data signals D[1] to D[m] to the data lines D1 to Dm, respectively. The data driver 1430 can program data to the pixels PX by applying the data signals D[1] to D[m] having a set voltage range (for example, a predetermined voltage range) to the data lines D1 to Dm according to the scan signals S[1] to S[n] that are gate-on voltages and are respectively applied to the scan lines S1 to Sn.

By way of example and not limitation, the display device 1400 may be any product or component having a display function such as a mobile phone, a tablet computer, a television, a display, a notebook computer, a digital photo frame, a navigator, and the like.

Although the foregoing discussion contains several specific implementation details, these should not be construed as limitations on the scope of the disclosure, but rather as descriptions of features that may be limited to a specific embodiment. Particular features described in different embodiments in this specification can also be implemented in combination in a single embodiment. In contrast, different features described in a single embodiment may also be implemented in multiple embodiments separately or in any suitable sub-combination.

The foregoing is merely specific embodiments of the present disclosure, and the protection scope of the present disclosure is not limited thereto. Any changes or replacements easily conceived of by a person skilled in the art within the technical scope disclosed by the present disclosure are encompassed in the scope of the disclosure. Therefore, the protection scope of the present disclosure should be based on the scope of the appended claims.

What is claimed is:

1. A sub-pixel structure comprising:
    a light emitting device comprising a first electrode layer and a second electrode layer arranged opposite to each other, wherein the first electrode layer and the second electrode layer together define an optical microcavity;
    a first refractive layer disposed at a light exit surface of the light emitting device, wherein the first refractive layer is operable to reflect a portion of light emitted by the light emitting device back into the optical microcavity for interference; and
    a second refractive layer disposed on a side of the first refractive layer facing away from the light exit surface, wherein the second refractive layer is operable to reflect a portion of the light emitted by the light emitting device and transmitting through the first refractive layer back into the optical microcavity for interference, the second refractive layer comprises a plurality of sections having different thicknesses, the plurality of sections is arranged in a plane that is parallel to the light exit surface, each of the plurality of sections is separately arranged such that there is a gap between orthographic projections of every two immediately adjacent ones of the plurality of sections on the first refractive layer.

2. The sub-pixel structure of claim 1, wherein each of the plurality of sections is shaped such that an orthographic projection of each section on the first refractive layer has a shape selected from the group consisting of a square and a ring.

3. The sub-pixel structure of claim 1, wherein the second refractive layer is sized such that an orthographic projection of the second refractive layer on the first refractive layer completely covers the first refractive layer.

4. The sub-pixel structure of claim 1, wherein the second refractive layer is sized such that an orthogonal projection of the second refractive layer on the first refractive layer covers only part of the first refractive layer.

5. The sub-pixel structure of claim 4, wherein the second refractive layer is shaped such that the orthogonal projection of the second refractive layer on the first refractive layer has a shape selected from the group consisting of a square and a ring.

6. The sub-pixel structure of claim 1, wherein the first refractive layer has a different refractive index from a refractive index of the second refractive layer.

7. The sub-pixel structure of claim 6, wherein the refractive index of the first refractive layer and the refractive index of the second refractive layer differ by at least 0.3.

8. A pixel structure comprising a plurality of sub-pixel structures arranged side by side, wherein at least one of the sub-pixel structures is the sub-pixel structure recited in claim 1.

9. The pixel structure of claim 8, wherein each of the plurality of sub-pixel structures is the sub-pixel structure recited in claim 1, and wherein the second refractive layer of at least one of the sub-pixel structures is sized such that an orthographic projection of the second refractive layer on the first refractive layer completely covers the first refractive layer.

10. The pixel structure of claim 8, wherein each of the plurality of sub-pixel structures is the sub-pixel structure recited in claim 1, wherein the second refractive layer of each of the sub-pixel structures comprises a plurality of sections having different thicknesses, and wherein the plurality of sections is arranged in a plane parallel to the light exit surface.

11. The pixel structure of claim 10, wherein the second refractive layer of each of the plurality of sub-pixel structures are arranged such that portions of the second refractive layers alongside a boundary between every two immediately adjacent ones of the sub-pixel structures are combined and share a same thickness.

12. The pixel structure of claim 8, wherein each of the plurality of sub-pixel structures is the sub-pixel structure recited in claim 1, and wherein the second refractive layer of each of the sub-pixel structures is sized such that an orthogonal projection of the second refractive layer on the first refractive layer covers only part of the first refractive layer.

13. The pixel structure of claim 12, wherein the second refractive layer of each of the plurality of sub-pixel structures share a same thickness and are arranged such that the second refractive layer of one of the sub-pixel structures is combined with the second refractive layer of an immediately adjacent one of the sub-pixel structures.

14. A display panel comprising a plurality of the pixel structures recited in claim 8, the pixel structures being arranged in an array.

15. The display panel of claim 14, wherein only one of the plurality of sub-pixel structures of each of the plurality of pixel structures includes the second refractive layer, and wherein the second refractive layer either comprises a plurality of sections having different thicknesses and arranged in a plane parallel to the light exit surface, is sized such that its orthographic projection on the first refractive layer covers only part of the first refractive layer, or both.

16. A display device comprising the display panel recited in claim 15.

17. The display panel of claim 15, wherein each of the one of the plurality of sub-pixel structures including the second refractive layer are operable to emit light of a same color.

18. The display panel of claim 17, wherein the light of the same color is blue light.

* * * * *